(12) United States Patent
Seo et al.

(10) Patent No.: US 10,008,642 B2
(45) Date of Patent: Jun. 26, 2018

(54) SEMICONDUCTOR LIGHT EMITTING DEVICES

(71) Applicant: Samsung Electronics Co., Ltd., Suwon-si, Gyeonggi-do (KR)

(72) Inventors: Jong Wan Seo, Ansan-si (KR); Jin Ha Kim, Yongin-si (KR); Kwang Bok Woo, Hanam-si (KR); Dong Hoon Lee, Suwon-si (KR); Won Joon Lee, Seoul (KR); Sun Hwan Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/364,739

(22) Filed: Nov. 30, 2016

(65) Prior Publication Data
US 2017/0309793 A1 Oct. 26, 2017

(30) Foreign Application Priority Data
Apr. 25, 2016 (KR) .................. 10-2016-0050215

(51) Int. Cl.
*H01L 33/50* (2010.01)
*H01L 33/38* (2010.01)
(Continued)

(52) U.S. Cl.
CPC ............ *H01L 33/504* (2013.01); *H01L 33/38* (2013.01); *H01L 33/46* (2013.01); *H01L 33/50* (2013.01); *H01L 33/502* (2013.01); *H01L 33/62* (2013.01)

(58) Field of Classification Search
CPC ...... H01L 33/50; H01L 33/502; H01L 33/504; H01L 33/08; H01L 33/52; H01L 33/62
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |

(Continued)

FOREIGN PATENT DOCUMENTS

| JP | 2000031532 A | 1/2000 |
| JP | 2000042525 A | 2/2000 |

(Continued)

*Primary Examiner* — Phat X Cao
(74) *Attorney, Agent, or Firm* — Harness, Dickey & Pierce, PLC

(57) ABSTRACT

A semiconductor light emitting device may include a semiconductor light emitting diode (LED) chip, a light-transmitting film on the LED chip, and a light-transmitting bonding layer between the light-transmitting film and the semiconductor LED chip. At least one of the light-transmitting film and the light-transmitting bonding layer may include a wavelength conversion material configured to convert light emitted by the semiconductor LED chip into light having a wavelength different from a wavelength of the emitted light. The light-transmitting bonding layer may have a lateral inclined region extending to the lateral surface to form an inclined surface. The semiconductor light emitting device may further include a reflective packaging portion surrounding the light-transmitting bonding layer, covering the first surface such that an electrode of the LED chip is at least partially exposed. The reflective packaging portion may include a reflective material.

14 Claims, 11 Drawing Sheets

(51) Int. Cl.
*H01L 33/46* (2010.01)
*H01L 33/62* (2010.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2002/0003233 A1 | 1/2002 | Mueller-Mach et al. |
| 2003/0101676 A1* | 6/2003 | Maeda .............. B29C 70/30 52/649.1 |
| 2012/0217523 A1 | 8/2012 | Chang et al. |
| 2015/0236224 A1* | 8/2015 | Kwak ................ G02B 6/0023 362/612 |
| 2015/0236228 A1 | 8/2015 | Kim et al. |
| 2016/0093777 A1* | 3/2016 | Sato ..................... H01L 25/167 257/98 |
| 2016/0095184 A1* | 3/2016 | Nakabayashi ......... H05B 33/22 313/503 |
| 2016/0161098 A1* | 6/2016 | Tudorica ............... F21V 29/10 315/51 |
| 2016/0276293 A1* | 9/2016 | Hung ................... H01L 33/60 |

FOREIGN PATENT DOCUMENTS

| | | |
|---|---|---|
| JP | 2002042525 A | 2/2002 |
| JP | 2004071726 A | 3/2004 |
| JP | 2007123576 A | 5/2007 |
| KR | 20130020010 A | 2/2013 |
| KR | 101478124 B1 | 1/2015 |
| KR | 101567807 B1 | 11/2015 |

\* cited by examiner

SEMICONDUCTOR LIGHT EMITTING DEVICES

CROSS-REFERENCE TO RELATED APPLICATIONS

This application claims benefit of priority to Korean Patent Application No. 10-2016-0050215, filed on Apr. 25, 2016 in the Korean Intellectual Property Office, the disclosure of which is incorporated herein by reference in its entirety.

BACKGROUND

1. Field

The present inventive concepts relate to semiconductor light emitting devices.

2. Description of Related Art

Semiconductor light emitting diodes (LEDs) may include materials included therein that are configured to emit light using electric energy. Semiconductor LEDs may convert energy, generated by a recombination of electrons and holes of bonded semiconductors, into light, and emit the light. Such LEDs are widely used as light sources of lighting devices and backlight devices for large liquid crystal displays, and development of the LEDs is being gradually accelerated.

In some cases, LEDs may be provided as light emitting devices packaged in various forms so as to be easily mounted in application devices. In an SP packaging process of such LEDs, optical loss or total reflection due to other components may cause problems, such as a decrease in the final optical efficiency of products, or an increase in color variations.

SUMMARY

Some aspects of the present inventive concepts may provide a semiconductor light emitting device that may improve optical efficiency by reducing and/or minimizing optical loss.

According to some example embodiments of the present inventive concepts, a semiconductor light emitting device may include a semiconductor light emitting diode (LED) chip, a light-transmitting film, a light-transmitting bonding layer, and a reflective packaging portion. The semiconductor LED chip may have a first surface, an electrode on the first surface, a second surface opposing the first surface, and a lateral surface between the first surface and the second surface. The light-transmitting film may be on the second surface of the semiconductor LED chip. The light-transmitting bonding layer may be between the light-transmitting film and the semiconductor LED chip. The light-transmitting bonding layer may be configured to bond the light-transmitting film to the semiconductor LED chip. The light-transmitting bonding layer may include a lateral inclined region extending to the lateral surface of the semiconductor LED chip to form an inclined surface. The reflective packaging portion may surround the light-transmitting bonding layer, the reflective packaging portion covering the first surface of the semiconductor LED chip such that the electrode is at least partially exposed from the reflective packaging portion, the reflective packaging portion including a reflective material. At least one of the light-transmitting film and the light-transmitting bonding layer may include a wavelength conversion material, the wavelength conversion material configured to convert light emitted by the semiconductor LED chip into light having a wavelength different from a wavelength of the emitted light.

According to some example embodiments of the present inventive concepts, a method of manufacturing a semiconductor light emitting device may include: providing a light transmitting film; applying a plurality of instances of light-transmitting bonding resin in an uncured state on the light-transmitting film at regular intervals, such that the instances of light-transmitting bonding resin are spaced apart on the light-transmitting film according to a substantially common interval; disposing a plurality of semiconductor LED chips on separate, respective instances of light-transmitting bonding resin, each semiconductor LED chip including a first surface on which an electrode is located, such that, for each given semiconductor chip disposed on a given instance of light-transmitting bonding resin, the first surface of the given semiconductor LED chips is distal from the light transmitting film and a portion of the given instance of light-transmitting bonding resin extends along a lateral surface of the given semiconductor LED chip; curing the light-transmitting bonding resin of each instance of light-transmitting bonding resin, such that the semiconductor LED chips are bonded to the light-transmitting film concurrently with maintaining the portions of the light-transmitting bonding resin extending on the lateral surfaces of the semiconductor LED chips; and forming a reflective packaging portion that surrounds the semiconductor LED chips bonded to the light-transmitting film, the reflective packaging portion including a reflective material. At least one of the light-transmitting film and the light-transmitting bonding resin includes a wavelength conversion material, the wavelength conversion material configured to convert light emitted by one or more of the semiconductor LED chips into light having a wavelength different from a wavelength of the emitted light.

According to some example embodiments of the present inventive concepts, a semiconductor light emitting device may include a semiconductor light emitting diode (LED) chip; a light-transmitting film on the semiconductor LED chip; and a light-transmitting bonding layer between the light-transmitting film and the semiconductor LED chip. At least one of the light-transmitting film and the light-transmitting bonding layer includes a wavelength conversion material, the wavelength conversion material configured to convert light emitted by the semiconductor LED chip into light having a wavelength different from a wavelength of the emitted light.

According to some example embodiments of the present inventive concepts, a semiconductor light emitting device may include a semiconductor light emitting diode (LED) chip; and a light-transmitting bonding layer on the semiconductor LED chip. The light-transmitting bonding layer includes a wavelength conversion material, the wavelength conversion material configured to convert light emitted by the semiconductor LED chip into light having a wavelength different from a wavelength of the emitted light.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concepts will be described in detail with reference to the attached drawings.

Figure 1:
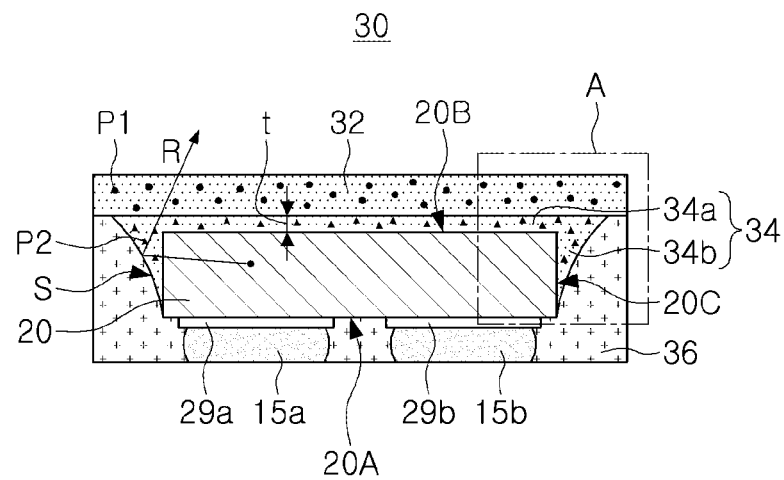
FIG. 1 is a cross-sectional view of a semiconductor light emitting device according to some example embodiments.
Figure 2:
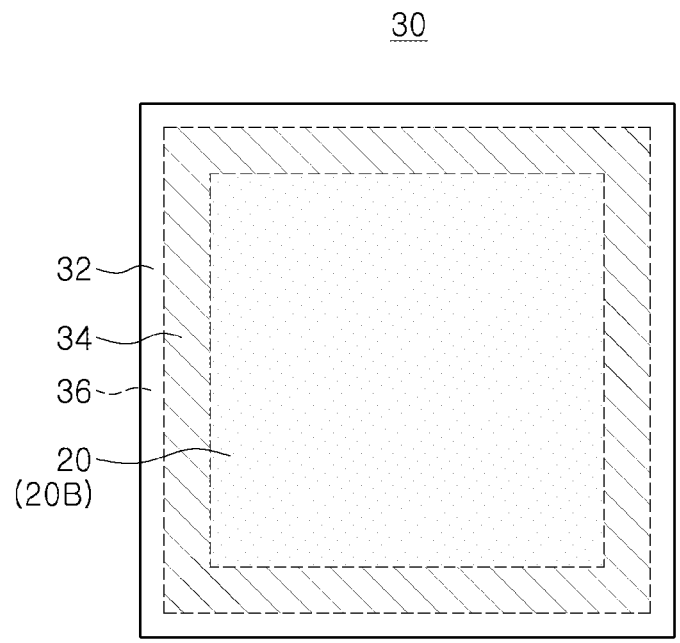
FIG. 2 is a plan view of the semiconductor light emitting device illustrated in FIG. 1.

FIG. 1 is a cross-sectional view of a semiconductor light emitting device according to some example embodiments of the present inventive concepts. FIG. 2 is a plan view of the semiconductor light emitting device illustrated in FIG. 1.

Referring to FIG. 1, a semiconductor light emitting device 30 according to some example embodiments may include a semiconductor light emitting diode (LED) chip 20, a light-transmitting film 32 disposed on a surface of the semiconductor LED chip 20, and a light-transmitting bonding layer 34 bonding the semiconductor LED chip 20 to the light-transmitting film 32.

The semiconductor LED chip 20 may have a first surface 20A, a second surface 20B opposing the first surface 20A, and at least one lateral surface 20C disposed in a space between the first surface 20A and the second surface 20B. The first surface 20A may be an electrode formation surface on which a first electrode 29a and a second electrode 29b may be disposed. The second surface 20B may be provided as a main light emitting surface of the semiconductor LED chip 20.

Figure 5:
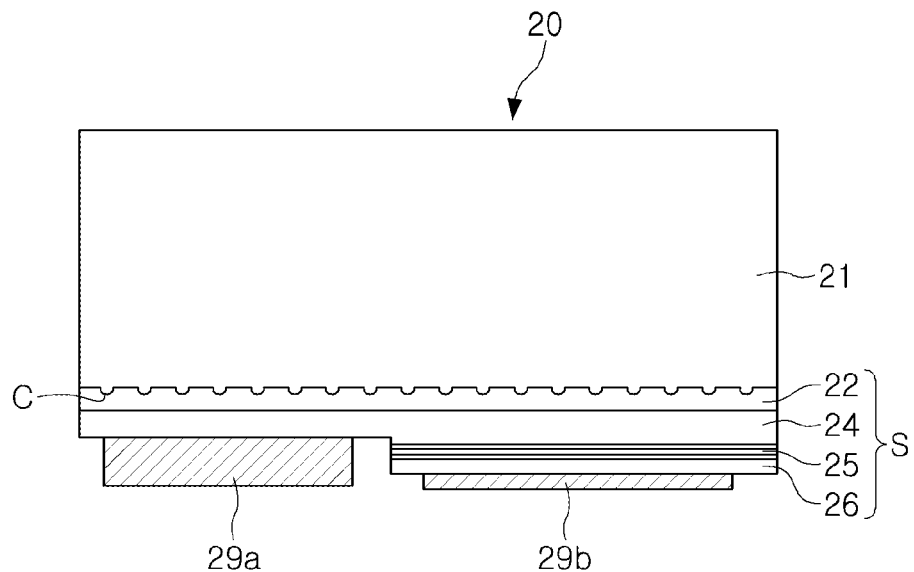
FIG. 5 is a cross-sectional view of a semiconductor light emitting diode (LED) chip employed in the semiconductor light emitting device illustrated in FIG. 1.

As illustrated in FIG. 5, the semiconductor LED chip 20 employed in some example embodiments may include a substrate 21, and a first conductive semiconductor layer 24, an active layer 25, and a second conductive semiconductor layer 26 sequentially disposed on the substrate 21. A buffer layer 22 may be disposed in a space between the substrate 21 and the first conductive semiconductor layer 24.

The substrate 21 may be an insulating substrate, such as sapphire. The present inventive concepts are not, however, limited thereto, and the substrate 21 may be a conductive substrate or a semiconductor substrate, in addition to the insulating substrate. For example, the substrate 21 may be SiC, silicon (Si), $MgAl_2O_4$, MgO, $LiAlO_2$, $LiGaO_2$, or GaN, in addition to sapphire. An uneven pattern C may be formed on an upper surface of the substrate 21. The uneven pattern C may increase light extraction efficiency, and may improve the quality of a single crystal being grown.

The buffer layer 22 may have a composition of $In_xAl_yGa_{1-x-y}N$ (0≤x≤1, 0≤y≤1). For example, the buffer layer 22 may include GaN, AlN, AlGaN, or InGaN. In some example embodiments, the buffer layer 22 may also be formed by combining a plurality of layers or gradually changing compositions thereof.

The first conductive semiconductor layer 24 may be a nitride semiconductor layer having a composition of n-type $In_xAl_yGa_{1-x-y}N$ (0≤x<1, 0≤y<1, 0≤x+y<1), and an n-type impurity may be silicon (Si). For example, the first conductive semiconductor layer 24 may include n-type GaN. The second conductive semiconductor layer 26 may be a nitride semiconductor layer having a composition of p-type $In_xAl_yGa_{1-x-y}N$ (0≤x<1, 0≤y<1, 0≤x+y<1), and a p-type impurity may be magnesium (Mg). For example, the second conductive semiconductor layer 26 may be implemented as a single layer structure, but as in some example embodiments, may have a multilayer structure having different compositions. The active layer 25 may have a multi quantum well (MQW) structure, in which quantum well layers and quantum barrier layers are alternately stacked on each other. For example, the quantum well layers and the quantum barrier layers may include different compositions of $In_xAl_yGa_{1-x-y}N$ (0≤x≤1, 0≤y<1, 0≤x+y<1), respectively. In a certain example, the quantum well layers may include a composition of $In_xGa_{1-x}N$ (0<x≤1), and the quantum barrier layers may include GaN or AlGaN. The thicknesses of the quantum well layers and the quantum barrier layers may range from 1 nm to 50 nm, respectively. The active layer 25 is not limited to the MQW structure, and may have a single quantum well (SQW) structure.

The first and second electrode 29a and 29b may be disposed on a mesa-etched region of the first conductive semiconductor layer 24, and the second conductive semiconductor layer 26, respectively, so that the first and second electrodes 29a and 29b may be positioned on the same side (a first surface). The first electrode 29a is not limited thereto, may include a material, such as silver (Ag), nickel (Ni), aluminum (Al), chromium (Cr), rhodium (Rh), palladium (Pd), iridium (Ir), ruthenium (Ru), magnesium (Mg), zinc (Zn), platinum (Pt), or gold (Au), and may be employed as a structure having a single layer or two or more layers. If necessary, the second electrode 29b may be a transparent electrode, such as a transparent conductive oxide or a transparent conductive nitride, or may also include graphene. The second electrode 29b may include at least one of aluminum (Al), gold (Au), chromium (Cr), nickel (Ni), titanium (Ti), or tin (Sn).

The light-transmitting bonding layer 34 may include at least a wavelength conversion material converting a wavelength of light emitted by the semiconductor LED chip 20. Some example embodiments include a first wavelength conversion material P1 and a second wavelength conversion material P2 not only in the light-transmitting bonding layer 34 but also in the light-transmitting film 32, but the present inventive concepts is not limited thereto.

In particular, the semiconductor LED chip 20 may include the light-transmitting film 32 disposed on an upper surface thereof (for example, on the second surface 20B). The light-transmitting film 32 employed in some example embodiments may be provided as a wavelength conversion film including a wavelength conversion material. The wavelength conversion material included in the light-transmitting film 32 may be the first wavelength conversion material P1 configured to convert a portion of light, emitted by the semiconductor LED chip 20, into first light having a first wavelength different from a wavelength of the emitted light. The light-transmitting film 32 may be a resin layer that includes the first wavelength conversion material P1. In some example embodiments, the light-transmitting film 32 may be a ceramic film, which is a sintered body formed of (e.g., at least partially comprising) a ceramic phosphor. For example, the light-transmitting film 32 may be a glass layer including the first wavelength conversion material P1, such as a phosphor or a quantum dot (QD).

The light-transmitting film 32 may be wider than the semiconductor LED chip 20. As illustrated in FIG. 2, the light-transmitting film 32 may have a central surface area covering the second surface 20B of the semiconductor LED chip 20 and an outer surface area surrounding the central surface area, where the outer surface area extends beyond the second surface 20B.

In some example embodiments, the light-transmitting bonding layer 34 may bond the light-transmitting film 32 to the second surface 20B of the semiconductor LED chip 20. The light-transmitting bonding layer 34 may have an extending region 34b disposed along the lateral surface 20C of the semiconductor LED chip 20, in addition to a bonding region 34a disposed in a space between the light-transmitting film 32 and the semiconductor LED chip 20. The light-transmitting bonding layer 34 may include a wavelength conversion bonding resin that includes the second wavelength conversion material P2. The light-transmitting bonding resin may include at least one of a silicone, an epoxy, a polyacrylate, a polyimide, a polyamide, and a benzocyclobutene. The second wavelength conversion material P2 may be a wavelength conversion material, such as a phosphor or a QD, configured to convert light emitted by the semiconductor LED chip 20 into second light having a shorter wavelength than the first wavelength of the first light.

The bonding region 34a of the light-transmitting bonding layer 34 may have a thickness t, at which the light-transmitting film 32 may maintain bonding strength thereof. For example, the thickness t of the bonding region 34a may vary depending on a component of the light-transmitting bonding layer 34, but may be at least 15 μm. The thickness t of the bonding region 34a may be changed according to a size and an amount of a wavelength conversion material, such as an employed phosphor, in addition to the bonding strength. For example, the thickness t of the bonding region 34a may be determined to be greater than a particle size (d50) (for example, 5 μm to 40 μm) of the employed phosphor, and when a large amount of the phosphor is required, may be increased to be even larger than the particle size. When the phosphor disposed in the bonding region 34a is required in a large amount (disposing a certain phosphor, such as a red phosphor, in the bonding region 34a), the thickness t of the bonding region 34a may be larger than or equal to 50 μm.

The first and second wavelength conversion materials P1 and P2 employed in some example embodiments may be divided into the light-transmitting film 32 and the light-transmitting bonding layer 34, according to a conversion wavelength. For example, while the light-transmitting bonding layer 34 adjacent to the semiconductor LED chip 20 may include the second wavelength conversion material P2 configured to provide light having a relatively long wavelength, the light-transmitting film 32 may include the first wavelength conversion material P1 configured to provide light having a relatively short wavelength.

The semiconductor light emitting device 30 may emit white light. In some example embodiments, the semiconductor LED chip 20 may emit blue light (e.g., light having a wavelength between about 450 nm and about 495 nm). For example, the semiconductor LED chip 20 may emit light having a dominant wavelength from 440 nm to 460 nm. The first wavelength conversion material P1 may be a phosphor or a QD configured to convert at least a portion of blue light into yellow light (e.g., light having a wavelength between about 570 nm and about 590 nm) or green light (e.g., light having a wavelength between about 495 nm and about 570 nm). The second wavelength conversion material P2 may be a phosphor or a QD configured to convert at least a portion of blue light into yellow light or green light. In some example embodiments, the first and second wavelength conversion materials P1 and P2 available will be described in more detail.

In some example embodiments, in a path on which light emitted by the semiconductor LED chip 20 may travel, the first and second wavelength conversion materials P1 and P2 may be disposed in an order of the second and first wavelength conversion materials P2 and P1, and light having a long wavelength, converted by the second wavelength conversion material P2, may thus be limited and/or prevented from being absorbed into the first wavelength conversion material P1. In some example embodiments, light converted by the first wavelength conversion material P1 may travel through the second wavelength conversion material P2, and thus, converted light having a short wavelength may be absorbed into the second wavelength conversion material P2, while an amount of the light may be lost. However, the disposition of the first and second wavelength conversion materials P1 and P2 according to some example embodiments may result in an optical loss due to such a reabsorption process of light to be reduced and/or prevented.

In some example embodiments, the light-transmitting bonding layer 34 may have the extending region 34b disposed on one or more lateral surfaces 20C of the semiconductor LED chip 20. The extending region 34b may form an inclined surface S that is beneficial to the extraction of light, such that the extending region 34b is configured to reduce internal total reflection of the lateral surface of the semiconductor LED chip 20. The inclined surface S may be coupled to a reflective packaging portion 36, so that the inclined surface S may be provided as a reflective surface, thus configuring the semiconductor light emitting device to have increased light extraction efficiency.

Figure 3:
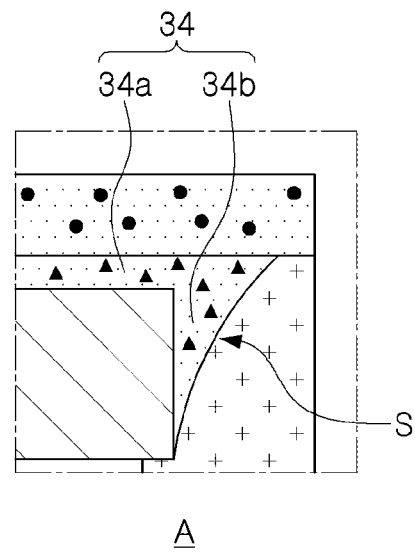
FIG. 3 is a partially enlarged view of the semiconductor light emitting device illustrated in FIG. 1.

As illustrated in FIGS. 1 and 3, the width of the extending region 34b may become greater in a direction towards the light-transmitting film 32. The surface shape of the extending region 34b may vary according to a viscosity or an amount of a non-cured resin for the light-transmitting bonding layer 34 (refer to FIGS. 8 and 9).

Figure 4:
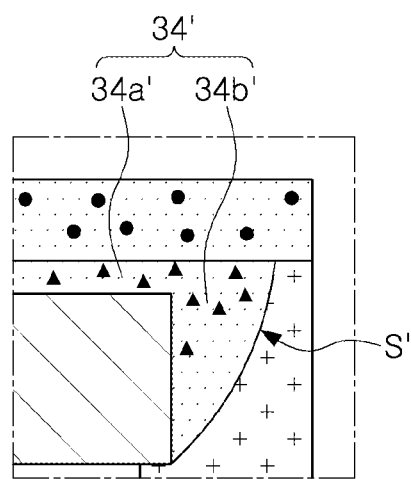
FIG. 4 is a partially enlarged view of a semiconductor light emitting device according to some example embodiments.

In some example embodiments, including the example embodiments illustrated in at least FIG. 1 and FIG. 3, the inclined surface S of the extending region 34b may have a concave, curved surface. For example, the concave, curved surface may have a meniscus shape, and may be implemented when a bonding resin has a relatively low viscosity. In another example, if and/or when the viscosity of the bonding resin is relatively high, as illustrated in FIG. 4, an extending region 34b' of a light-transmitting bonding layer 34' may have a convex, curved surface S'. As such, an inclined surface of an extending region 34b may have various forms of curved surfaces.

The present inventive concepts is not limited thereto, and the inclined surface S of the extending region 34b may have an inclined angle of about 45° or below, with respect to the lateral surface of the semiconductor LED chip 20.

A light-transmitting resin forming (e.g., at least partially comprising) the light-transmitting bonding layer 34 may be configured to enable an additional increase in light extraction efficiency associated with the semiconductor light emitting device 30 to be expected, by a properly selected refractive index. For example, the light-transmitting resin may be a silicone resin having a refractive index from 1.38 to 1.8.

As illustrated in FIGS. 1 and 2, the reflective packaging portion 36 surrounding the light-transmitting bonding layer 34 may be disposed below the light-transmitting film 32. An interface between the light-transmitting bonding layer 34 and the reflective packaging portion 36 may function as a reflective surface, and the reflective surface may be defined by the inclined surface S. The reflective surface may effectively guide light to the light-transmitting film 32 (indicated as "R"). The reflective packaging portion 36 may be formed of a light-transmitting resin that contains a reflective powder. The reflective powder may be a white ceramic powder or a white metallic powder. For example, the white ceramic powder may include at least one selected from the group consisting of $TiO_2$, $Al_2O_3$, $Nb_2O_5$ and $ZnO$. The white metallic powder may include a material, such as aluminum (Al) or silver (Ag).

The light-transmitting bonding layer 34 employed in some example embodiments may provide the extending region 34b that is beneficial to light extraction, and may include a wavelength conversion material, such as a phosphor. Thus, light entering the interior of light-transmitting bonding layer 34 may effectively leave it, again.

In some example embodiments, the reflective packaging portion 36 may surround the light-transmitting bonding layer 34 and may cover the first surface 20A of the semiconductor LED chip 20. To be configured to secure an electrical connection, the first and second electrodes 29a and 29b may be at least partially exposed, exposed, and/or substantially exposed (e.g., exposed within manufacturing tolerances and/or material tolerances) without being covered. As such, the reflective packaging portion 36 may guide even light emitted to a lower surface of the semiconductor light emitting device 30 to be emitted in a desired direction.

In some example embodiments, first and second conductive bumps 15a and 15b disposed on the first and second electrodes 29a and 29b may further be included. The reflective packaging portion 36 may be substantially coplanar (e.g., coplanar within manufacturing tolerances and/or material tolerances) with the first and second conductive bumps 15a and 15b. A lateral surface of the reflective packaging portion 36 may be coplanar or substantially coplanar with a lateral surface of the light-transmitting film 32.

Figure 6:
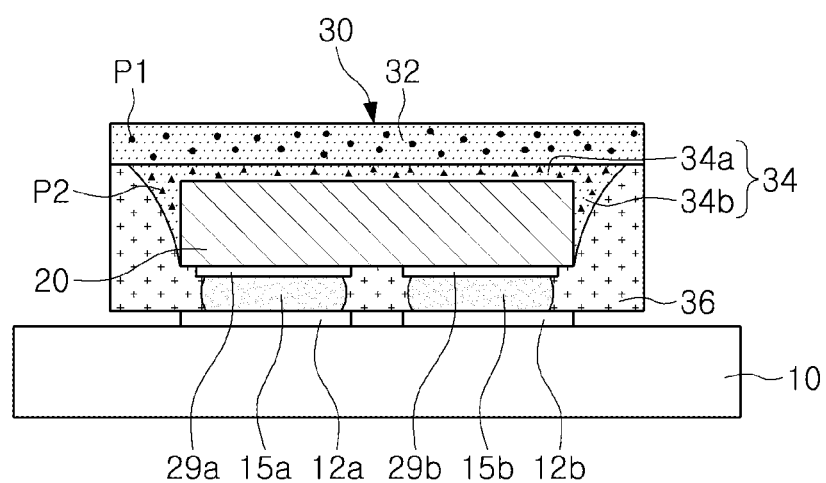
FIG. 6 is a cross-sectional view of a semiconductor light emitting device according to some example embodiments.

FIG. 6 is a cross-sectional view of a semiconductor light emitting device according to some example embodiments of the present inventive concepts.

Referring to FIG. 6, the semiconductor light emitting device 30 according to some example embodiments may be illustrated as being mounted on a package substrate 10.

The semiconductor light emitting device 30 may be mounted on the package substrate 10 in a flip-chip manner. First and second wiring electrodes 12a and 12b of the package substrate 10 may be connected to the first and second electrodes 29a and 29b of the semiconductor LED chip 20 using the first and second conductive bumps 15a and 15b.

In some example embodiments, along a path on which the semiconductor LED chip 20 is configured to emit light, the first and second wavelength conversion materials P1 and P2 may be disposed in the order of the second and first wavelength conversion materials P2 and P1, such that the first and second wavelength conversion materials are collectively configured to limit and/or prevent light having a long wavelength, converted by the second wavelength conversion material P2, from being absorbed into the first wavelength conversion material P1. The reflective packaging portion 36 may surround the extending region 34b of the light-transmitting bonding layer 34. The reflective packaging portion 36 may cover the first surface 20A of the semiconductor LED chip 20, such that the semiconductor light emitting device 30 is configured to effectively emit light from the LED chip 20 to the light-transmitting film 32.

FIGS. 7 through 12 are cross-sectional views of a process of manufacturing the semiconductor light emitting device illustrated in FIG. 1.

Figure 7:
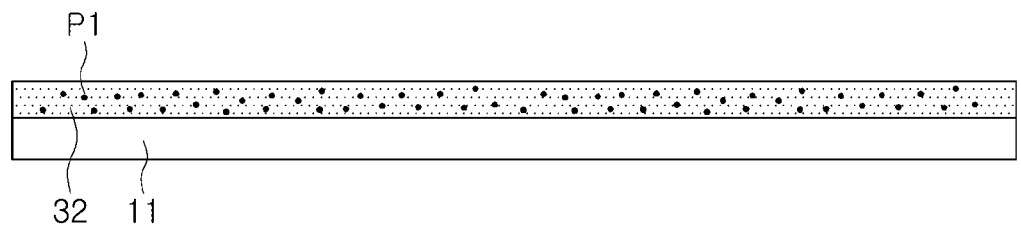
FIG. 7 is a cross-sectional view of at least a portion of a process of manufacturing the semiconductor light emitting device illustrated in FIG. 1.

As illustrated in FIG. 7, the light-transmitting film 32 may be disposed on a supporter 11. In some example embodiments, the supporter 11 includes a substrate. The light-transmitting film 32 may include the first wavelength conversion material P1 configured to convert a portion of light, emitted by a semiconductor LED chip, into first light having a first wavelength different from that of the emitted light. For example, the first wavelength conversion material P1 may be a yellow or green phosphor.

The light-transmitting film 32 may be provided in various forms. For example, the light-transmitting film 32 may be a resin layer including the first wavelength conversion material P1. In some example embodiments, the light-transmitting film 32 may be a film-type sintered body formed of a ceramic phosphor. In a certain example, the light-transmitting film 32 may be a glass layer including the first wavelength conversion material P1, such as a phosphor or a QD. The glass layer may include glass fired at low temperatures (for example, 400° C. or below). The light-transmitting film 34 may have a sufficient area such that a separate apparatus may have a greater area than that of the semiconductor LED chip 20.

Figure 8:
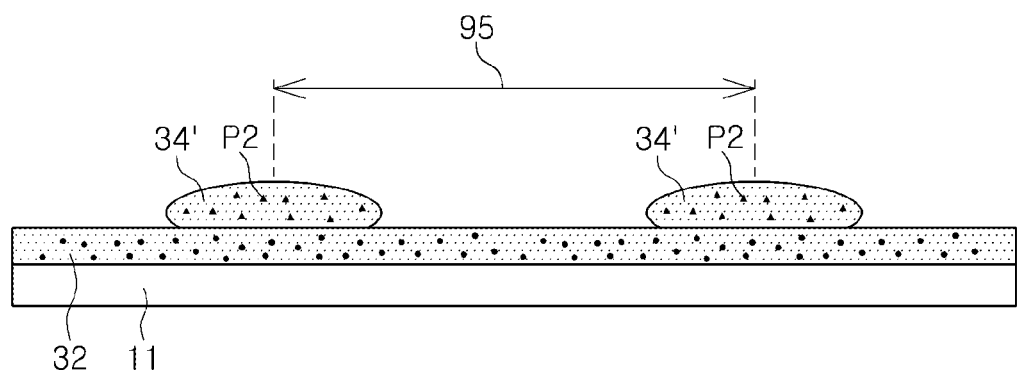
FIG. 8 is a cross-sectional view of at least a portion of a process of manufacturing the semiconductor light emitting device illustrated in FIG. 1.

As illustrated in FIG. 8, separate instances of a bonding resin 34', including the second wavelength conversion material P2 in a non-cured state, may be applied to the light-transmitting film 32. As further illustrated, the separate instances may be spaced apart according to an interval 95. The intervals 95 between separate instances of bonding resin 34' may be a substantially common internal 95.

The application process may enable semiconductor LED chips to be used and desired semiconductor light emitting devices to be disposed at regular intervals. The second wavelength conversion material P2 may be a wavelength conversion material, such as a phosphor or a QD, which is configured to convert light, emitted by the semiconductor LED chip 20, into second light having a shorter wavelength than that of the first light. For example, the second wavelength conversion material P2 may be a red phosphor. The bonding resin 34' in the non-cured state may include at least one selected from the group consisting of a silicone, an epoxy, a polyacrylate, a polyimide, a polyamide, or a benzocyclobutene. The bonding resin 34' may be in the non-cured state, and may thus be provided in droplet form by surface tension, as illustrated in FIG. 8.

Figure 9:
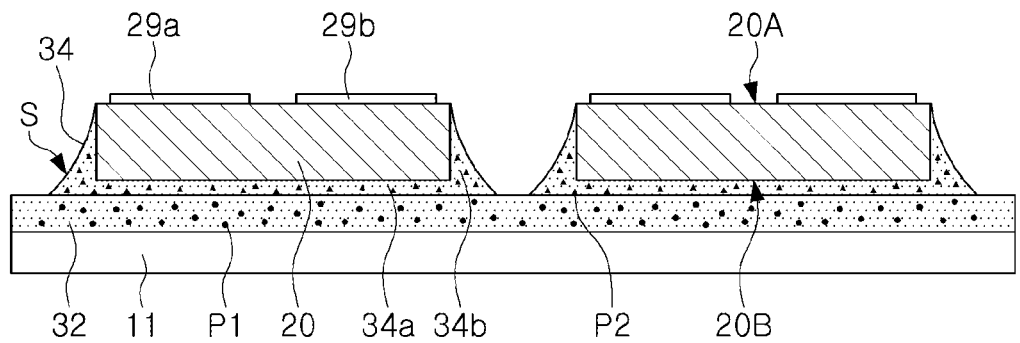
FIG. 9 is a cross-sectional view of at least a portion of a process of manufacturing the semiconductor light emitting device illustrated in FIG. 1.

As illustrated in FIG. 9, a plurality of semiconductor LED chips 20 may be disposed on the bonding resin 34'. As shown in FIG. 9, the semiconductor LED chips 20 may be disposed on separate, respective instances of bonding resin 34'. The semiconductor LED chips 20 may each have a surface 20A on which one or more electrodes 29a and 29b are located, and the semiconductor LED chips 20 may be disposed on separate, respective instances of bonding resin such that the surfaces 20A of the respective semiconductor LEDs chips 20 are distal from the light-transmitting film 32.

After the disposition process, the bonding resin 34' may be cured to form the light-transmitting bonding layer 34, concurrently with maintaining the extending regions 34b thereof extending on the lateral surfaces of the semiconductor LED chips 20. The light-transmitting bonding layer 34 may bond the second surface 20B of the semiconductor LED chip 20 to the light-transmitting film 32. In the deposition process prior to the curing process, the non-cured bonding resin 34' may rise along the lateral surface of the semiconductor LED chip 20, except for an amount of the bonding resin 34' used for the bonding process. A degree of the rising and the surface shape of the bonding resin 34', according to this aspect of the present inventive concepts, may be adjusted using the viscosity and amount of the bonding resin 34'. The viscosity of the bonding resin 34' may be controlled by adding a thixotropic agent. For example, the thixotropic agent may be silica particles.

Resultantly, the light-transmitting bonding layer 34 may have the extending region 34b disposed on the lateral surface of the semiconductor LED chip 20, along with the bonding region 34a disposed in a space between the semiconductor LED chip 20 and the light-transmitting film 32. Further, the extending region 34b, disposed on the lateral surface of the semiconductor LED chip 20, may have the inclined surface S. The inclined surface S may have a concave surface, formed by a bonding resin in a non-cured state, for example, a meniscus shape.

Figure 10:
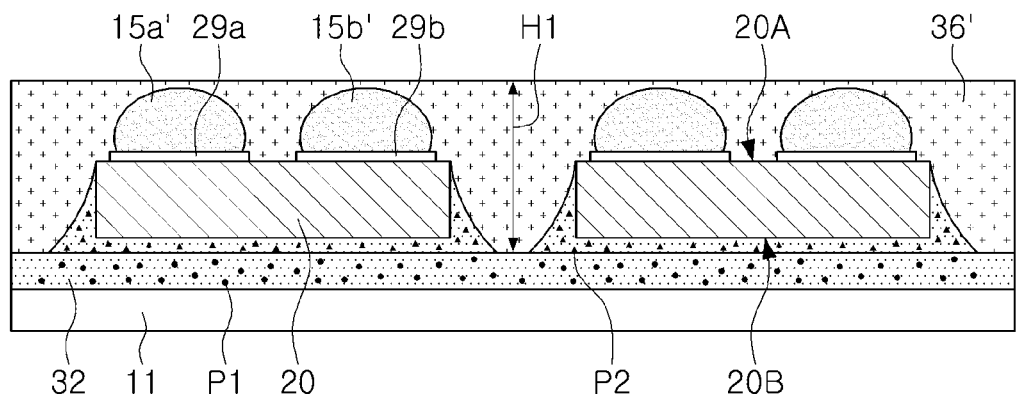
FIG. 10 is a cross-sectional view of at least a portion of a process of manufacturing the semiconductor light emitting device illustrated in FIG. 1.

As illustrated in FIG. 10, a first conductive bump 15a' and a second conductive bump 15b' may be formed on the first electrode 29a and the second electrode 29b of each of the semiconductor LED chips 20, and a packaging resin 36' may be applied.

The packaging resin 36' may be formed of a light-transmitting resin that contains a reflective powder. The reflective powder may be a white ceramic powder or a white metallic powder. For example, the white ceramic powder may include at least one selected from the group consisting of $TiO_2$, $Al_2O_3$, $Nb_2O_5$ and ZnO. The white metallic powder may include a material, such as aluminum (Al) or silver (Ag). An interface between the packaging resin 36' and the light-transmitting bonding layer 34 may be provided as a reflective surface guiding light to the light-transmitting film 32.

The packaging resin 36' may be applied to have a height H1, at which the first and second conductive bumps 15a' and 15b' may be covered thereby.

Figure 11:
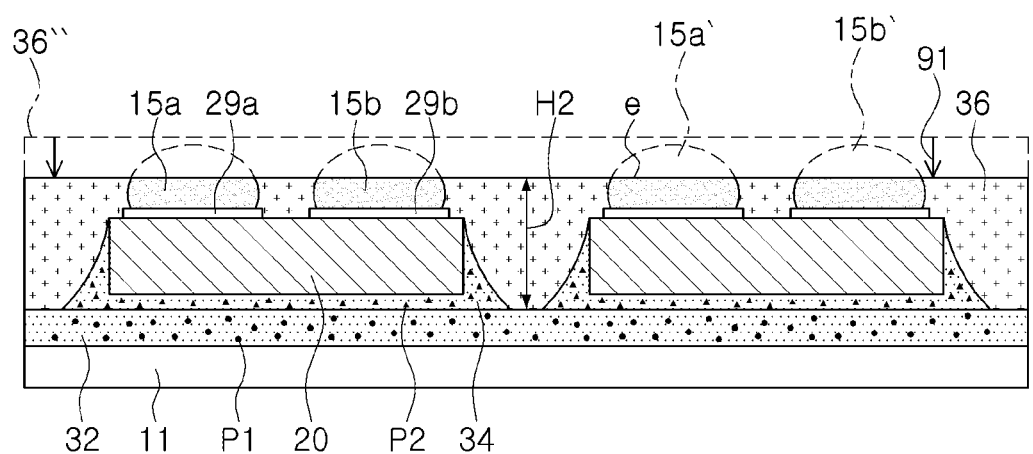
FIG. 11 is a cross-sectional view of at least a portion of a process of manufacturing the semiconductor light emitting device illustrated in FIG. 1.

Subsequently, the packaging resin 36' may be cured, and as illustrated in FIG. 11, may be polished 91 so as to remove an upper portion 36" of the packaging resin 36 and upper portions 15a' and 15b' of the electrodes 15a and 15b. The polishing 91 may at least partially expose a surface of each of the first and second conductive bumps 15a and 15b. An at least partially exposed surface "e" of each of the first and second conductive bumps 15a and 15b may be provided as a bonding region in a subsequent mounting process (refer to FIG. 6). If necessary, a bonding metal may be added. In the polishing process, the packaging resin 36' may be provided to have a relatively low height H2 to form the reflective portion 36.

Figure 12:
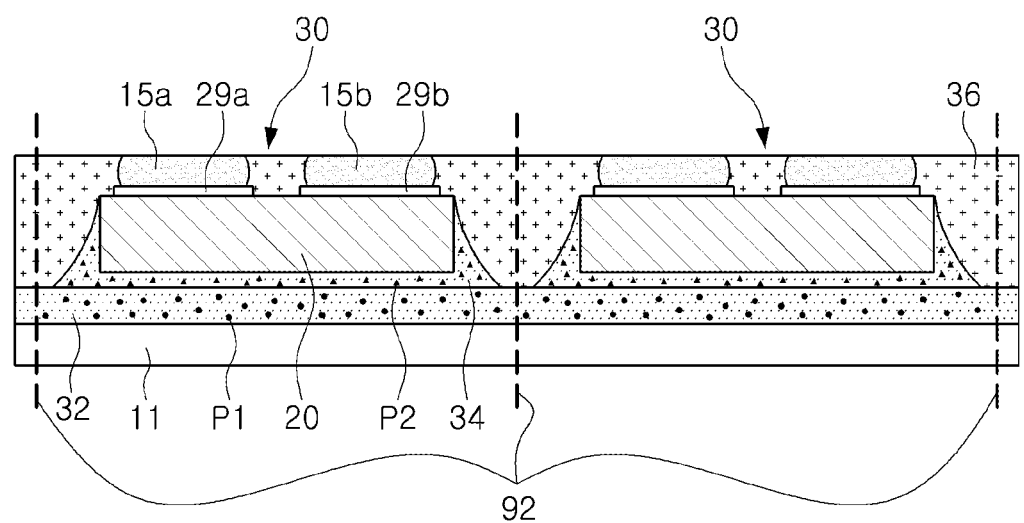
FIG. 12 is a cross-sectional view of at least a portion of a process of manufacturing the semiconductor light emitting device illustrated in FIG. 1.

Subsequently, as illustrated in FIG. 12, a product obtained in such a manner may be cut ("segmented") 92 to separate the semiconductor LED chips 20 from each other, thereby forming ("providing") the separate semiconductor light emitting devices 30, illustrated in FIG. 1. The segmenting 92 may include segmenting 92 at least one of the light-transmitting film 32, the supporter 11, the light-transmitting bonding layers 34, and the reflective portion 36 to form separate semiconductor light emitting devices 30.

A cut lateral surface of the semiconductor light emitting device 30 may be substantially coplanar with the light-transmitting film 32 and the reflective packaging portion 36. The light-transmitting bonding layer 34 may not be exposed on the lateral surface.

Figure 13:
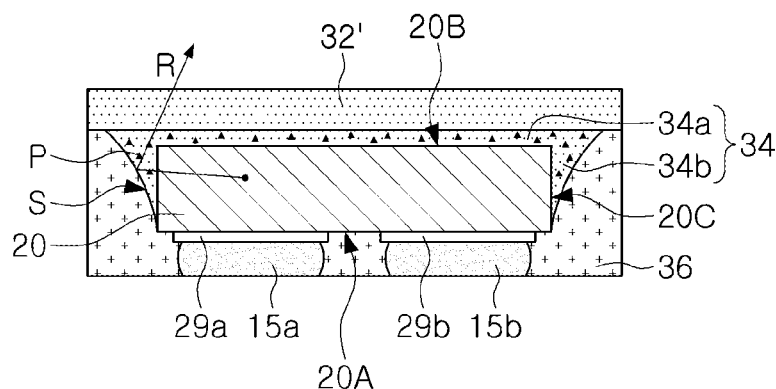
FIG. 13 is a cross-sectional view of a semiconductor light emitting device according to some example embodiments.

FIG. 13 is a cross-sectional view of a semiconductor light emitting device according to some example embodiments of the present inventive concepts.

A semiconductor light emitting device 30A illustrated in FIG. 13 may be understood as being similar to the semiconductor light emitting device 30, illustrated in FIG. 1, except for a disposition of the wavelength conversion material P. A component according to some example embodiments may be understood with reference to a description of the same or a similar component of the semiconductor light emitting device 30, illustrated in FIG. 1, unless otherwise specified.

In some example embodiments, the wavelength conversion material P may be disposed only in the light-transmitting bonding layer 34 and not in a light transmitting film 32'. The semiconductor LED chip 20 may be a blue or ultraviolet (UV) LED chip. The wavelength conversion material P may be a yellow phosphor.

Figure 14:
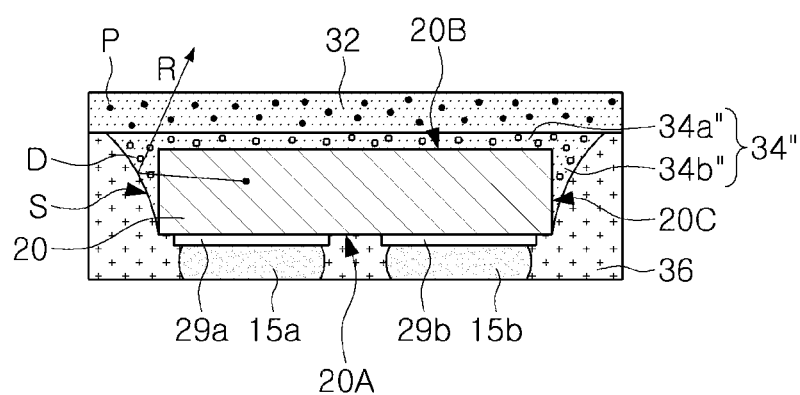
FIG. 14 is a cross-sectional view of a semiconductor light emitting device according to some example embodiments.

FIG. 14 is a cross-sectional view of a semiconductor light emitting device according to some example embodiments of the present inventive concepts.

A semiconductor light emitting device 30B, illustrated in FIG. 14, may be understood as being similar to the semiconductor light emitting device 30, illustrated in FIG. 1, except for a disposition of the wavelength conversion material P and an addition of a light dispersion material D. A component according to some example embodiments may be understood with reference to a description of the same or similar component of the semiconductor light emitting device 30, illustrated in FIG. 1, unless otherwise specified.

In some example embodiments, the wavelength conversion material P may be disposed only in the light-transmitting film 32. The semiconductor LED chip 20 may be a blue or UV LED chip (e.g., an LED chip configured to emit blue light or ultraviolet light), and the wavelength conversion material P may be a yellow phosphor. A light-transmitting bonding layer 34″ employed in some example embodiments may include the light dispersion material D in lieu of a wavelength conversion material. The light dispersion material D may include particles having a refractive index different from that of the light-transmitting bonding resin, and may be, for example, at least one of $SiO_2$ (n=1.45), $TiO_2$ (n=1.48) and $Al_2O_3$ (n=2.73). In some example embodiments, the light dispersion material D may be disposed along with a wavelength conversion material. For example, a wavelength conversion material may be disposed in the light-transmitting bonding layer 34″, along with the light dispersion material D.

Figure 15:
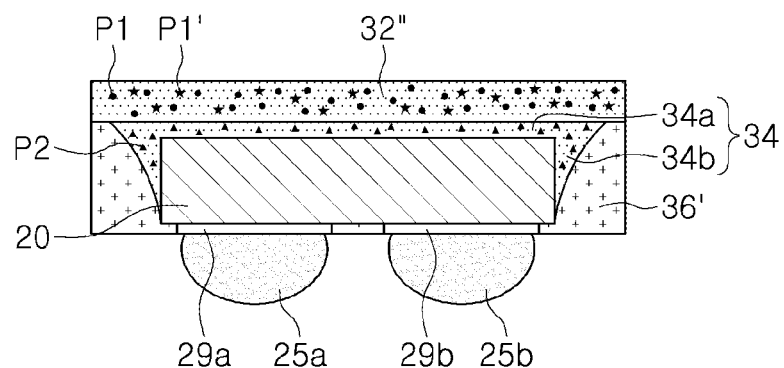
FIG. 15 is a cross-sectional view of a semiconductor light emitting device according to some example embodiments

FIG. 15 is a cross-sectional view of a semiconductor light emitting device according to some example embodiments of the present inventive concepts.

A semiconductor light emitting device 30C, illustrated in FIG. 15, may be understood as being similar to the semiconductor light emitting device 30, illustrated in FIG. 1, except for dispositions of wavelength conversion materials P1 and P1' and a shape of a reflective packaging portion 36'. A component according to some example embodiments may be understood with reference to a description of the same or similar component of the semiconductor light emitting device 30, illustrated in FIG. 1, unless otherwise specified.

The semiconductor LED chip 20 may be a blue or UV LED chip. The light-transmitting film 32' employed in some example embodiments may include the wavelength conversion materials P1 and P1'. The wavelength conversion materials P1 and P1' may be green and yellow phosphors, respectively. In this case, a wavelength conversion material P2 included in the light-transmitting bonding layer 34 may be a red phosphor having a long wavelength.

In some example embodiments, the reflective packaging portion 36' may be disposed on the second surface 20B of the semiconductor LED chip 20 such that the first and second electrodes 29a and 29b of the semiconductor LED chip 20 may be at least partially exposed prior to formation of a first conductive bump 25a and a second conductive bump 25b. For example, the reflective packaging portion 36' may be formed on the second surface of the semiconductor LED chip 20, and the first and second conductive bumps 25a and 25b may be formed, followed by at least partially exposing the first and second electrodes 29a and 29b through a polishing process.

Figure 16:
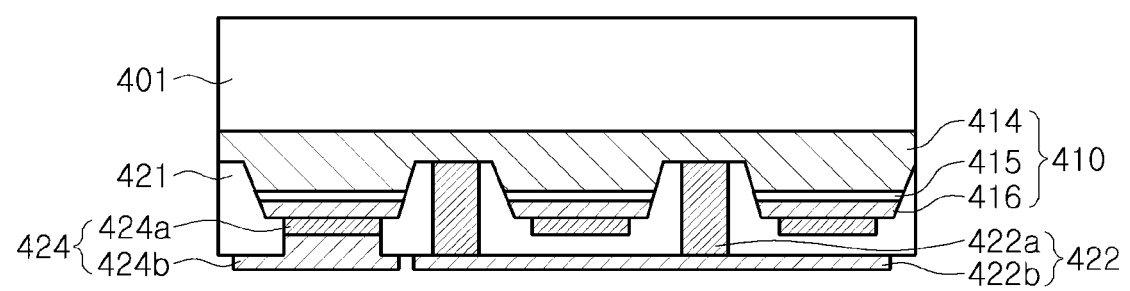
FIG. 16 is a cross-sectional view of an example of a semiconductor LED chip employable in a semiconductor light emitting device according to some example embodiments.

A semiconductor LED chip employable in some example embodiments is not limited to the structure illustrated in FIG. 3, and chips having various different structures, such as a flip-chip bonding structure or the like, may be used. FIG. 16 is a cross-sectional view of another example of a semiconductor LED chip employable in the semiconductor light emitting devices illustrated in FIGS. 1 and 13 through 15.

FIG. 16 is a cross-sectional view of an example of a semiconductor LED chip employable according to some example embodiments of the present inventive concepts.

Referring to FIG. 16, a semiconductor LED chip 400 may include a semiconductor stack 410 formed on a substrate 401. The semiconductor stack 410 may include a first conductive semiconductor layer 414, an active layer 415, and a second conductive semiconductor layer 416.

The semiconductor LED chip 400 may include a first electrode 422 and a second electrode 424, respectively connected to the first conductive semiconductor layer 414 and the second conductive semiconductor layer 416. The first electrode 422 may include connecting electrode portions 422a, such as a conductive via, passing through the second conductive semiconductor layer 416 and the active layer 415, in order to be connected to the first conductive semiconductor layer 414, and a first electrode pad 422b connected to the connecting electrode portions 422a. The connecting electrode portions 422a may be surrounded by insulating portions 421, in order to be electrically separated from the active layer 415 and the second conductive semiconductor layer 416. The connecting electrode portions 422a may be disposed in an area from which the semiconductor stack 410 is etched. The connecting electrode portions 422a may be appropriately designed in number, shape, pitch or contact area with the first conductive semiconductor layer 414 such that contact resistance may be reduced. Further, the connecting electrode portions 422a may be arranged to form rows and columns on the semiconductor stack 410 to improve current flow. The second electrode 424 may include an ohmic contact layer 424a and a second electrode pad 424b on the second conductive semiconductor layer 416.

The connecting electrode portions 422a and the ohmic contact layer 424a may have a monolayer or a multilayer structure formed of the first and second conductive semiconductor layers 414 and 416 and a conductive material having ohmic characteristics. For example, the connecting electrode portions 422a and the ohmic contact layer 424a may be formed using a process of depositing or sputtering at least one material, such as silver (Ag), aluminum (Al), nickel (Ni), chromium (Cr), or a transparent conductive oxide (TCO).

The first and second electrode pads 422b and 424b may be connected to the connecting electrode portions 422a and the ohmic contact layer 424a, respectively, to function as an external terminal of the semiconductor LED chip 400. For example, the first and second electrode pads 422b and 424b may include gold (Au), silver (Ag), aluminum (Al), titanium (Ti), tungsten (W), copper (Cu), tin (Sn), nickel (Ni), platinum (Pt), chromium (Cr), NiSn, TiW, AuSn, or eutectic metals thereof.

The first and second electrodes 422 and 424 may be disposed with each other in an identical direction, and may be mounted on a lead frame or the like in a so-called flip-chip form.

In addition, the two first and second electrodes 422 and 424 may be electrically separated from each other by the insulating portions 421. The insulating portions 421 may be any material having electrically insulating characteristics or any object having electrically insulating characteristics, but a material having low optical absorption. For example, a silicon oxide or a silicon nitride, such as $SiO_2$, $SiO_xN_y$, or $Si_xN_y$, may be used. If necessary, a light-reflective structure may be formed by dispersing a light-reflective powder in a light transmitting material. In some example embodiments, the insulating portions 421 may have a multilayer reflective structure in which a plurality of insulating films having different refractive indexes are alternately stacked. For example, the multilayer reflective structure may be a distributed Bragg reflector (DBR), in which a first insulating film having a first refractive index and a second insulating film having a second refractive index are alternately stacked.

The multilayer reflective structure may have insulating films having different refractive indexes and repeatedly stacked from 2 to 100 times. For example, the insulating films may be repeatedly stacked from 3 to 70 times, and further from 4 to 50 times. Each of the insulating films included in the multilayer reflective structure may be an oxide or nitride, such as $SiO_2$, SiN, $SiO_xN_y$, $TiO_2$, $Si_3N_4$, Al$_2$O$_3$, TiN, AlN, ZrO$_2$, TiAlN, or TiSiN, or combinations thereof. For example, when a wavelength of light generated by the active layer 415 is defined as A, and n is defined as a refractive index of a corresponding layer, each of the first and second insulating films may have a thickness of λ/4n, for example, a thickness of about 300 Å to about 900 Å. In this case, the multilayer reflective structure may be designed by selecting refractive indexes and thicknesses of the first and second insulating films, respectively, to have high reflectivity (for example, 95% or more) for the wavelength of light generated by the active layer 415.

The refractive indexes of the first and second insulating films may be determined to be about 1.4 to about 2.5, and may be smaller than a refractive index of the first conductive semiconductor layer 414 and that of the substrate 401, but may be greater than that of the substrate 401, while also being smaller than that of the first conductive semiconductor layer 414.

As set forth above, according to example embodiments of the present inventive concepts, when two or more types of wavelength conversion materials are adopted, a wavelength conversion material for light having a long wavelength may be disposed in front of a wavelength conversion material for light having a short wavelength, to limit and/or prevent a loss of converted short-wavelength light, thus increasing luminance.

In addition, the lateral surface of the semiconductor LED chip is configured to be inclined, in order to reduce an amount of light repeatedly received by the semiconductor LED chip, thus decreasing an optical loss due to total reflection.

Figure 17:
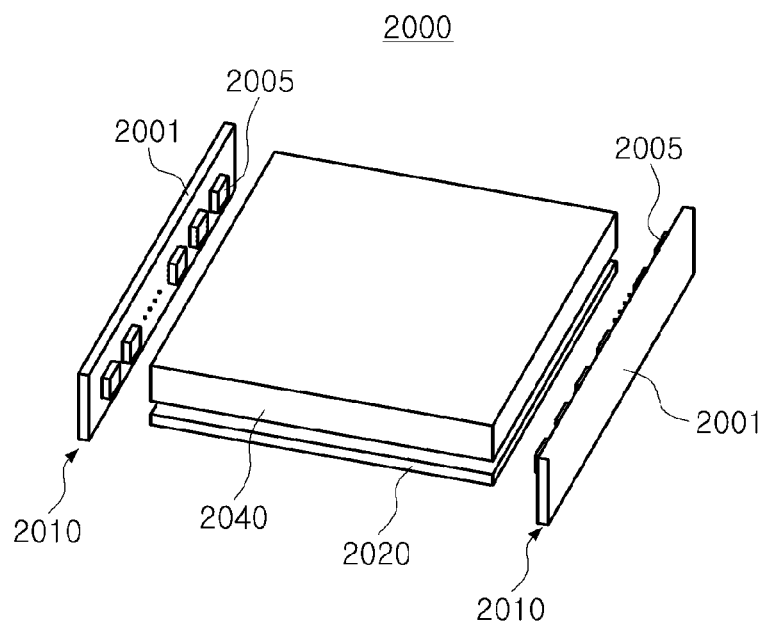
FIG. 17 is a perspective view schematically illustrating a backlight unit according to some example embodiments.
Figure 18:
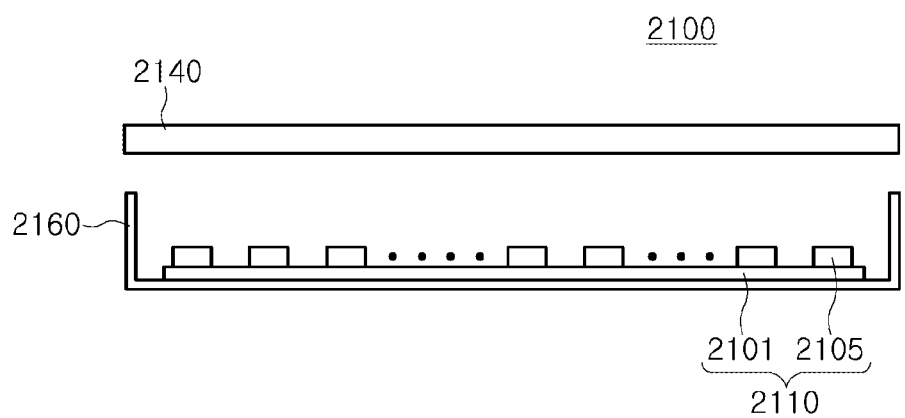
FIG. 18 illustrates a direct-type backlight unit according to some example embodiments.
Figure 19:
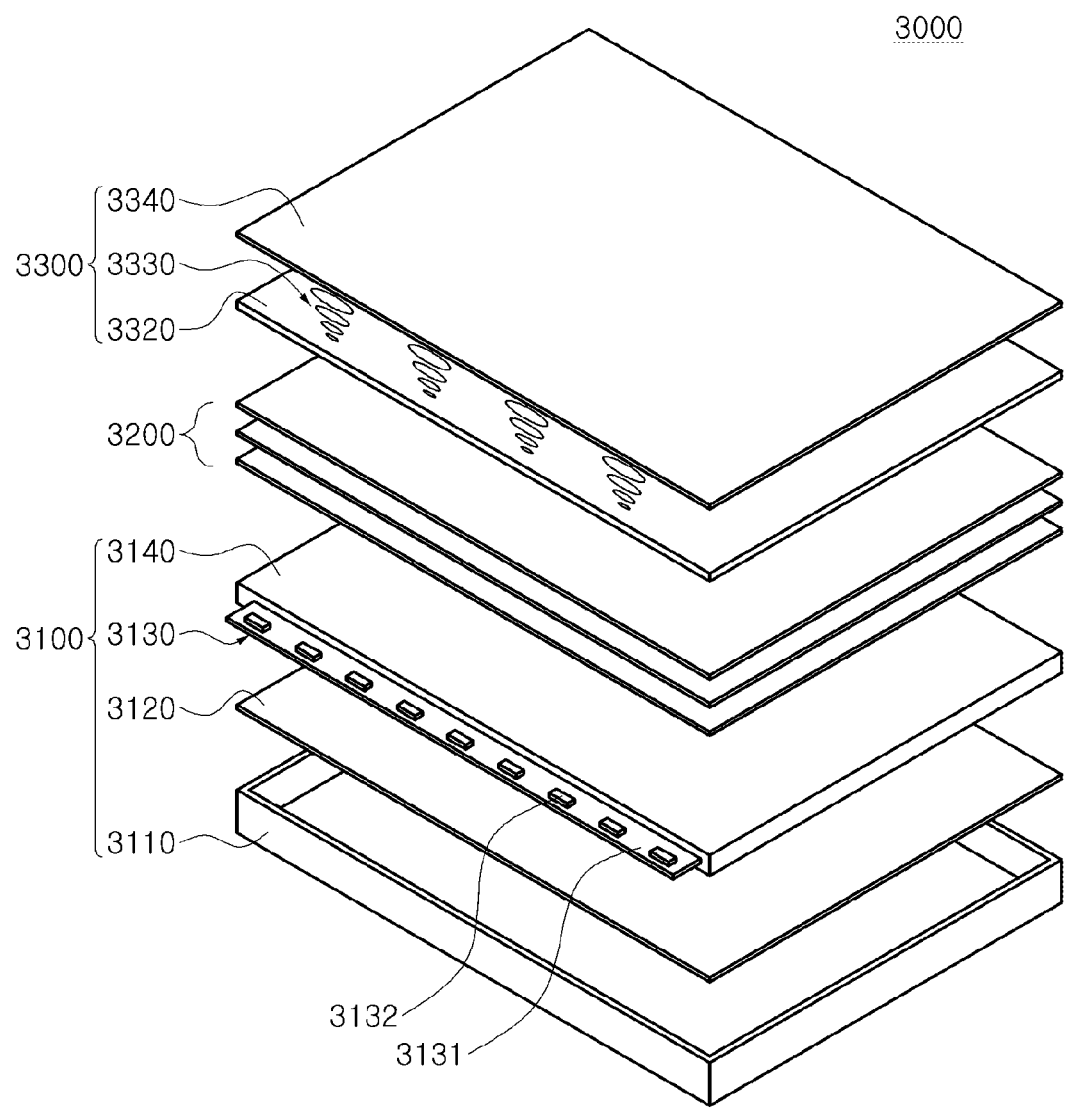
FIG. 19 is an exploded perspective view of a display device according to some example embodiments.

FIGS. 17, 18, and 19 illustrate backlight units according to some example embodiments.

FIG. 17 is a perspective view schematically illustrating a backlight unit according to some example embodiments.

Referring to FIG. 17, a backlight unit 2000 may include a light guide plate 2040 and a light source module 2010 disposed at each side of the light guide plate 2040. In addition, the backlight unit 2000 may further include a reflector 2020 disposed below the light guide plate 2040. The backlight unit 2000 according to the example embodiment may be an edge-type backlight unit.

In some example embodiments, the light source module 2010 may be provided on only one side of the light guide plate 2040, or additionally provided to the other side of the light guide plate 2040. The light source module 2010 may include a PCB 2001 and a plurality of light sources 2005 mounted on the PCB 2001. Here, the plurality of light sources 2005 may include the semiconductor light-emitting devices 100 to 900 according to various example embodiments of the inventive concepts.

FIG. 18 illustrates a direct-type backlight unit according to some example embodiments.

Referring to FIG. 18, a backlight unit 2100 may include a light diffusion plate 2140 and a light source module 2110 disposed below the light diffusion plate 2140. In addition, the backlight unit 2100 may further include a bottom case 2160 disposed below the light diffusion plate 2140 and accommodating the light source module 2110. The backlight unit 2100 according to the example embodiment may be the direct-type backlight unit.

The light source module 2110 may include a PCB 2101 and a plurality of light sources 2105 mounted on the PCB 2101. Here, the plurality of light sources 2105 may include the semiconductor light-emitting devices 100 to 900 according to various example embodiments of the inventive concepts.

FIG. 19 is an exploded perspective view of a display device according to some example embodiments.

Referring to FIG. 19, a display apparatus 3000 may include a backlight unit 3100, an optical sheet 3200, or an image display panel 3300 such as a liquid crystal panel.

The backlight unit 3100 may include a bottom case 3110, a reflector 3120, a light guide plate 3140, and a light source module 3130 disposed on at least one side of the light guide plate 3140. The light source module 3130 may include a PCB 3131 and light sources 3132. In particular, the light sources 3132 may be side-view type light-emitting devices mounted on a side adjacent to a light-emitting surface. The light sources 3132 may include one or more of the semiconductor light-emitting devices according to various example embodiments of the inventive concepts. For example, one or more of the light sources 3132 may include one or more of the semiconductor light-emitting devices 30, 30A, 30B, and 30C.

The optical sheet 3200 may be disposed between the light guide plate 3140 and the image display panel 3300, and may include various types of a sheet, such as a diffusion sheet, a prism sheet, or a protection sheet.

The image display panel 3300 may display an image using light emitted from the optical sheet 3200. The image display panel 3300 may include an array substrate 3320, a liquid crystal film 3330, and a color filter substrate 3340. The array substrate 3320 may include pixel electrodes arranged in a matrix form, thin-film transistors to apply a driving voltage to the pixel electrodes, and signal lines for operating the thin-film transistors. The color filter substrate 3340 may include a transparent substrate, a color filter, and a common electrode. The color filter may include filters selectively transmitting light having specific wavelengths in white light emitted from the backlight unit 3100. The liquid crystal film 3330 may be rearranged by an electric field formed between the pixel electrodes and the common electrode to adjust light transmittance. The light having the adjusted light transmittance may pass through the color filter of the color filter substrate 3340 to display the image. The image display panel 3300 may further include a driving circuit unit processing an image signal.

In the display apparatus 3000 according to some example embodiments, since the light sources 3132 emitting blue light, green light, and red light which have relatively narrow FWHMs, a blue color, a green color, and a red color having a relatively high color purities may be implemented after the emitted light passes through the color filter substrate 3340.

Figure 20:
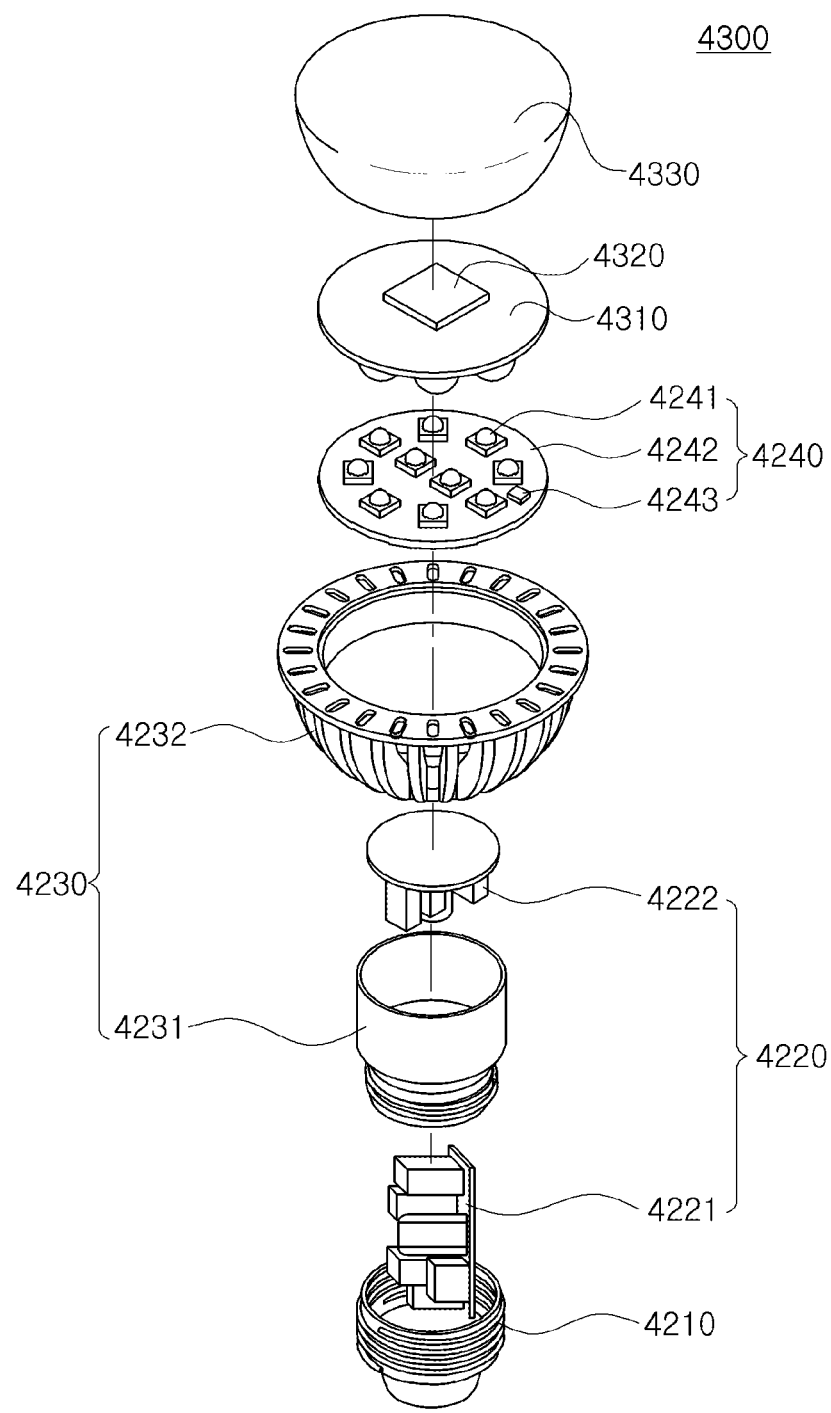
FIG. 20 is an exploded perspective view of an example of a lighting apparatus according to some example embodiments.

FIG. 20 is an exploded perspective view of an example of a lighting apparatus according to some example embodiments.

With reference to FIG. 20, a lighting apparatus 4300 may include a socket 4210, a power supply unit 4220, a heat radiating unit 4230, a light source unit 4240, and an optical unit 4330. According to at least one example embodiment of the present inventive concepts, the light source unit 4240 may include a substrate 4242, a plurality of light source modules 4241 mounted on the substrate 4242, and a controller 4243. The controller 4243 may store driving information of the plurality of light source modules 4241 therein.

The lighting apparatus 4300 may include a reflecting plate 4310 disposed above the light source unit 4240, and the reflecting plate 4310 allows light from the light source unit 4240 to be uniformly dispersed toward a lateral surface and a rear, whereby glare may be reduced.

A communications module 4320 may be mounted on an upper part of the reflecting plate 4310, and home-network communications may be implemented through the communications module 4320. For example, the communications module 4320 may be a wireless communications module using Zigbee®, Wi-Fi, or Li-Fi, and may control illumination of a lighting apparatus installed indoors or outdoors, such as on/off operations, brightness adjustment, or the like through a smartphone or a wireless controller. In addition, electronic product systems located indoors or outdoors, such as a TV, a refrigerator, an air conditioner, a door lock, or the like, as well as a vehicle, may be controlled by using a Li-Fi communications module using light having a visible wavelength of a lighting apparatus installed indoors or outdoors.

The reflecting plate 4310 and the communications module 4320 may be covered by an optical unit 4330.

The socket 4210 may be configured to replace an existing lighting apparatus. Electrical power supplied to the lighting apparatus 4300 may be applied through the socket 4210. As illustrated, the power supply unit 4220 may include a first power supply unit 4221 and a second power supply unit 4222 separated from and coupled to each other. The heat radiating unit 4230 may include an internal heat radiating portion 4231 and an external heat radiating portion 4232. The internal heat radiating portion 4231 may be directly connected to the light source unit 4240 and/or the power supply unit 4220, by which heat may be transferred to the external heat radiating portion 4232.

The optical unit 4330 may include an internal optical unit (not shown) and an external optical unit (not shown), and may be configured such that light emitted from the light source unit 4240 may be uniformly dispersed.

A plurality of light source modules 4241 of the light source unit 4240 may receive electrical power from the power supply unit 4220 and then emit light to the optical unit 4330. The light source modules 4241 may include a substrate, a black matrix, and a plurality of semiconductor light emitting devices that may one or more of the semiconductor light-emitting devices according to various example embodiments of the inventive concepts, including one or more of the semiconductor light-emitting devices 30, 30A, 30B, and 30C.

While example embodiments have been shown and described above, it will be apparent to those skilled in the art that modifications and variations could be made without departing from the scope of the present inventive concepts as defined by the appended claims.

What is claimed is:

1. A semiconductor light emitting device, comprising:
   a semiconductor light emitting diode (LED) chip having a first surface, an electrode on the first surface, a second surface opposing the first surface, and a lateral surface between the first surface and the second surface, the second surface being an upper surface of the semiconductor LED chip, the lateral surface being an outer side surface of the semiconductor LED chip;
   a light-transmitting film on the second surface of the semiconductor LED chip;
   a light-transmitting bonding layer between the light-transmitting film and the semiconductor LED chip, the light-transmitting bonding layer configured to bond the light-transmitting film to the semiconductor LED chip, the light-transmitting bonding layer including a bonding region covering an entirety of the second surface of the semiconductor LED chip and an extending region extending from the bonding region and at least partially covering the lateral surface of the semiconductor LED chip to form an inclined surface; and
   a reflective packaging portion surrounding the light-transmitting bonding layer, the reflective packaging portion covering the first surface of the semiconductor LED chip such that the electrode is at least partially exposed from the reflective packaging portion, the reflective packaging portion including a reflective material,
   wherein the light-transmitting film includes a first wavelength conversion material that is configured to convert light emitted by the semiconductor LED chip into light having a first wavelength different from a wavelength of the emitted light,
   wherein the light-transmitting bonding layer includes a second wavelength conversion material that is configured to convert light emitted by the semiconductor LED chip into light having a second wavelength different from a wavelength of the emitted light,
   wherein at least both the bonding region and the extending region of the light-transmitting bonding layer includes the second wavelength conversion material,
   wherein the second wavelength is longer than the first wavelength.

2. The semiconductor light emitting device of claim 1, wherein the inclined surface of the extending region includes a concave portion or a convex portion.

3. The semiconductor light emitting device of claim 1, wherein the reflective packaging portion includes a lateral surface that is substantially coplanar with a lateral surface of the light-transmitting film.

4. The semiconductor light emitting device of claim 1, wherein,
   the first wavelength conversion material includes at least one of a yellow phosphor and a green phosphor, and
   the second wavelength conversion material includes a red phosphor.

5. The semiconductor light emitting device of claim 1, wherein the light-transmitting bonding layer includes a light dispersion material.

6. The semiconductor light emitting device of claim 1, wherein the light-transmitting bonding layer includes a thixotropic agent.

7. The semiconductor light emitting device of claim 1, wherein the light-transmitting film is a wavelength conversion film that includes the wavelength conversion material.

8. The semiconductor light emitting device of claim 1, further comprising:
   a conductive bump on the electrode.

9. The semiconductor light emitting device of claim 8, wherein the reflective packaging portion includes at least one surface that is substantially coplanar with a surface of the conductive bump.

10. A semiconductor light emitting device, comprising:
    a semiconductor light emitting diode (LED) chip, the semiconductor LED chip including a first surface, a second surface opposing the first surface, and a lateral surface between the first surface and the second surface, the second surface being an upper surface of the semiconductor LED chip, the lateral surface being an outer side surface of the semiconductor LED chip;
    a light-transmitting film on the semiconductor LED chip; and
    a light-transmitting bonding layer between the light-transmitting film and the semiconductor LED chip, the light-transmitting bonding layer including a bonding region covering an entirety of the second surface of the semiconductor LED chip and an extending region extending from the bonding region and at least partially covering the lateral surface of the semiconductor LED chip to form an inclined surface;

wherein the light-transmitting film includes a first wavelength conversion material that is configured to convert light emitted by the semiconductor LED chip into light having a first wavelength different from a wavelength of the emitted light, wherein the light-transmitting bonding layer includes a second wavelength conversion material that is configured to convert light emitted by the semiconductor LED chip into light having a second wavelength different from a wavelength of the emitted light, wherein at least both the bonding region and the extending region of the light-transmitting bonding layer includes the second wavelength conversion material, wherein the second wavelength is longer than the first wavelength.

11. The semiconductor light emitting device of claim 10, wherein, the semiconductor light emitting diode (LED) chip includes an electrode on the first surface; and the semiconductor light emitting device further includes a reflective packaging portion surrounding the light-transmitting bonding layer, the reflective packaging portion partially covering the first surface of the semiconductor LED chip such that the electrode is at least partially exposed from the reflective packaging portion, the reflective packaging portion including a reflective material.

12. The semiconductor light emitting device of claim 10, wherein, the first wavelength conversion material includes at least one of a yellow phosphor and a green phosphor; and the second wavelength conversion material includes a red phosphor.

13. A semiconductor light emitting device, comprising:

a semiconductor light emitting diode (LED) chip, the semiconductor LED chip including a first surface, a second surface opposing the first surface, and a lateral surface between the first surface and the second surface, the second surface being an upper surface of the semiconductor LED chip, the lateral surface being an outer side surface of the semiconductor LED chip; and a light-transmitting bonding layer on the semiconductor LED chip, the light-transmitting bonding layer in direct contact with at least one surface of the semiconductor LED chip, the light-transmitting bonding layer including a bonding region covering an entirety of the second surface of the semiconductor LED chip and an extending region extending from the bonding region and at least partially covering the lateral surface of the semiconductor LED chip to form an inclined surface;

wherein the light-transmitting film includes a first wavelength conversion material that is configured to convert light emitted by the semiconductor LED chip into light having a first wavelength different from a wavelength of the emitted light, wherein the light-transmitting bonding layer includes a second wavelength conversion material that is configured to convert light emitted by the semiconductor LED chip into light having a second wavelength different from a wavelength of the emitted light, wherein both the bonding region and the extending region of the light-transmitting bonding layer includes the second wavelength conversion material, wherein the semiconductor light emitting device further includes a light-transmitting film on the light-transmitting bonding layer, wherein the second wavelength is longer than the first wavelength, wherein the first wavelength conversion material includes at least one of a yellow phosphor and a green phosphor, wherein the second wavelength conversion material includes a red phosphor.

14. The semiconductor light emitting device of claim 13, wherein, the semiconductor light emitting diode (LED) chip includes an electrode on the first surface; and the semiconductor light emitting device further includes a reflective packaging portion surrounding the light-transmitting bonding layer, the reflective packaging portion partially covering the first surface of the semiconductor LED chip such that the electrode is at least partially exposed from the reflective packaging portion, the reflective packaging portion including a reflective material.

* * * * *